United States Patent [19]

Ullery, Jr.

[11] 4,254,546
[45] Mar. 10, 1981

[54] PHOTOVOLTAIC CELL ARRAY

[75] Inventor: Lee R. Ullery, Jr., Landenberg, Pa.

[73] Assignee: SES, Incorporated, Newark, Del.

[21] Appl. No.: 940,919

[22] Filed: Sep. 11, 1978

Related U.S. Application Data

[60] Division of Ser. No. 827,927, Aug. 26, 1977, Pat. No. 4,127,424, which is a continuation-in-part of Ser. No. 747,849, Dec. 6, 1976, abandoned.

[51] Int. Cl.³ .............................................. B01J 17/00
[52] U.S. Cl. ...................................... 29/572; 29/589; 29/590; 252/513; 252/514
[58] Field of Search ......................... 29/572, 589, 590; 252/513, 514

[56] References Cited

U.S. PATENT DOCUMENTS

| 3,370,986 | 2/1968 | Amsterdam | 357/32 |
| 4,001,146 | 1/1977 | Horowitz | 252/514 |
| 4,004,057 | 1/1977 | Hoffman | 252/514 |

*Primary Examiner*—W. C. Tupman

[57] ABSTRACT

In a photovoltaic cell which comprises: a substrate, a bottom electrode, a first layer of cadmium sulfide, a second layer of cuprous sulfide forming a barrier junction with said first layer and a top electrode, the improvement wherein said substrate is an insulative ceramic material and the bottom electrode is a conductive ceramic layer fused to said substrate. Said conductive layer is optionally coated with a metal having a high electrical conductivity.

10 Claims, 2 Drawing Figures

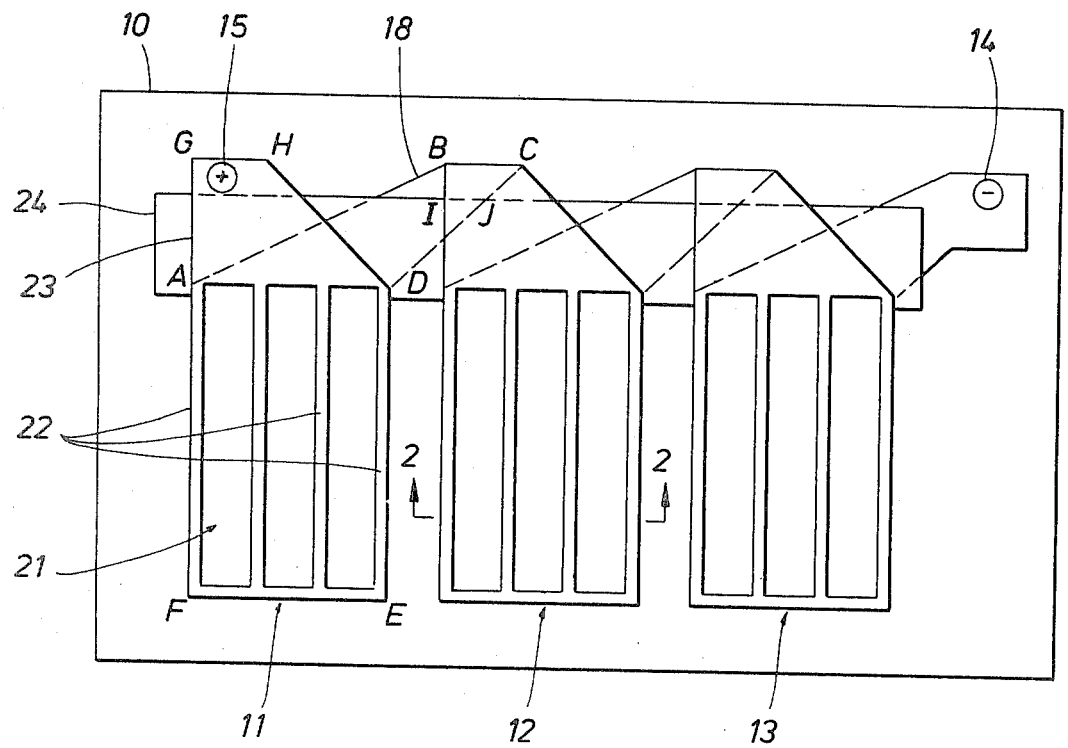
FIG.1
FIG. 2
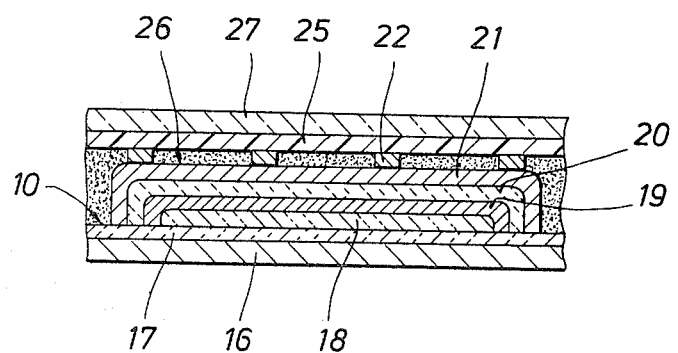

4,254,546

PHOTOVOLTAIC CELL ARRAY

This is a division of application Ser. No. 827,927, filed 8/26/77, now U.S. Pat. No. 4,127,424, which is a continuation-in-part of copending application Ser. No. 747,849, filed Dec. 6, 1976, now abandoned.

BACKGROUND OF THE INVENTION

1. Field of the Invention

This invention relates generally to solar cell arrays and a method of making them. More particularly, the invention relates to an integrated array of thin-film, photovoltaic cells connected in series and/or parallel and a method of making it.

2. The Prior Art

Since each commonly known, individual solar cell generates only a small amount of power, usually much less power than is required for most applications, the desired voltage and current is realized by interconnecting a plurality of solar cells in a series and parallel matrix. This matrix is generally referred to as a solar cell array, and generates electrical energy from solar radiation for a variety of uses.

Solar cell arrays can be made manually by bonding the individual cells to a suitable support in the desired configuration and connecting, e.g. by soldering, the electrical leads of the individual cells in the necessary manner to give the desired voltage and current. Manual construction of arrays suffers from a number of disadvantages, including cumbersome and difficult construction methods, expense, faulty connections, and the like. An integrated array and method of making it is described in U.S. Pat. No. 3,483,038, issued Dec. 9, 1969 to Hui et al. The patented array comprises a substrate of flexible plastic insulating material such as polyimide plastic to which a plurality of serially connected individual cells are integrally united. The individual cells comprise a bottom electrode of a three-layered metal film covered by a film of an n-type semiconductor such as cadmium sulfide and a film of p-type semiconductor such as cuprous sulfide to form a barrier layer, and a top electrode of a thin film of metal such as tellurium.

The use of flexible plastic films of the prior art as substrates has certain disadvantages. Many of the plastics are air and water permeable to a certain degree which makes it impossible to completely hermetically seal the final cell array and can result in degradation of the cell components over a period of time as air and water diffuse into the cell. It is frequently difficult to bond the metal electrode to the plastic. The plastic substrate is too flexible for many uses and cell manufacturing techniques, so rigidity must be built in by later encapsulation, or the flexible substrate must be supported with a rigid structure. Bonding the plastic film to a rigid structure can produce degradation of the film by mechanical deforming of the film from bonding pressures, or from heat used in thermal bonding or from solvents used in adhesives. Many plastics have absorption peaks in the infrared, resulting in high temperatures in use when these plastics are used in photovoltaic cell construction. Flexing of the substrate over a period of time of use tends to break down the films in the cells, reducing their output and shortening their life. The inherent flexibility of plastic substrate material increases processing complexity, since in order to obtain high resolution of array cells, the plastic film can not be subjected to stresses during the manufacturing process which would cause stretching and buckling. Use of a plastic substrate limits the temperature to which the cell can be subjected during fabrication.

Abrahamsohn in U.S. Pat. No. 3,376,163, issued Apr. 2, 1968, illustrates the use of commercially available conductive glass as a cell substrate. These are glasses that have a thin layer of conductive tin oxide on the surface. These glasses are typically produced by spraying a solution of tin chloride on hot glass, above 800° F. See U.S. Pat. No. 2,648,753, issued Aug. 11, 1953, to Lytle for a description of the process. This process has several disadvantages. Because the tin salt solution is sprayed onto a hot glass surface, the conductive layer is continuous on the surface of the glass and it is not possible to obtain the complicated grid pattern needed to obtain a parallel or series array of cells on a simple substrate.

SUMMARY OF THE INVENTION

The integrated array of the present invention comprises a plurality of thin-film photovoltaic cells connected in series and/or parallel and integrally united to a substrate of insulating ceramic. Each of the cells comprises a bottom electrode of conducting ceramic bonded to the substrate, a film of a first semiconductor material of one type conductivity covering the bottom electrode except for a minor portion which serves as a lead electrically connected with an electrode of an adjacent cell, a film of a second semiconductor material of an opposite type conductivity forming a p-n junction with the first semiconductor material, and a top electrode extending to and connecting with an electrode of an adjacent cell. One of the electrodes in each end cell in the array serves as a terminal for the array. A thin metallic film can be deposited on the bottom electrode to produce good adhesion and good ohmic contact between the bottom electrode and the first semiconductor film.

The insulative ceramic substrate and conductive ceramic electrode provide a number of advantages over the prior art. Good bonds between the substrate and bottom electrode and good adhesion of the cadmium sulfide film to the bottom electrode are obtained. The ceramic substrate provides sufficient rigidity to reduce flexurally induced damage to finished arrays. Higher temperatures can be used in the manufacture of the arrays. The ceramic substrate and conductive ceramic electrode have excellent vacuum processing characteristics, allowing high temperatures of operation with minimum outgassing. The rigidity of the substrate of this invention allows a high degree of resolution of array cells to be obtained during manufacture. Good hermetic seals can be obtained to exclude air and water.

BRIEF DESCRIPTION OF THE DRAWINGS

FIG. 1 is a plan view of one embodiment of an integrated array with cells in a side by side relationship and connected serially.

FIG. 2 is a cross-sectional view of cell 13 taken along line 2—2 of FIG. 1 showing the layers of the individual cell.

DESCRIPTION OF THE PREFERRED EMBODIMENTS

Referring to FIGS. 1 and 2 of the drawings, there is shown an integrated array of a plurality of serially connected, thin-film photovoltaic cells 11, 12 and 13, integrally formed on and united to a substrate 10 of insulating ceramic material. Although the integrated array described and illustrated herein has only three cells for the sake of clarity of explanation, the integrated array may have as many cells as are convenient and practical for any particular application. A row of cells in a side by side configuration and connected in series is shown; however, a plurality of rows of cells can be provided wherein some or all of the rows are connected in parallel with each other, as desired, to provide a predetermined power output.

The substrate is an insulative ceramic and is capable of withstanding high temperatures. The ceramic substrate has sufficient rigidity to structurally support a number of individual cells. While glass or other ceramic materials can be used, a particularly suitable substrate is sheet metal coated, preferably on one side, with a thin layer of ceramic. The metal imparts structural strength to an array and can be made sufficiently thin to impart some degree of flexibility if desired. Moreover, the use of metal facilitates overall fabrication of solar collectors, especially where heat exchange means are provided to remove thermal energy. Ceramic coated metal is readily available as it is used within the appliance industry for refrigerators, stoves, and the like and in the construction industry as panels for commercial buildings such as service stations. A suitable material is, for example "Mirawal," a trademark product of Kaiser Aluminum Company for cold rolled low-carbon steel sheets having a continuous coating of vitreous enamel on at least one side of the sheet. Desirable thickness of the sheet metal ranges from about 0.005 to about 0.030 inches, although thicknesses from about 0.012 to about 0.025 inches are also suitable. The thickness of the ceramic coat should be sufficient to insulate the sheet metal from the bottom electrode and desirably ranges from about 0.0015 to about 0.012 inches, although thicknesses from about 0.0025 to about 0.0065 are also suitable. The ceramic coating should be free from pinholes or other defects which would tend to result in short circuits to the sheet metal.

The individual cells are integrally formed on and united to the substrate. Any desired design configuration can be used other than that given in FIG. 1 for illustrative purposes. Each cell comprises a number of thin layers which, for the sake of clarity, are shown in an exaggerated manner in the drawing. The construction of a typical cell, e.g. cell 12, will be described in detail.

Substrate 10 comprising mild steel 16 coated with a thin film of insulating vitreous enamel 17 is coated with a thin layer of conductive ceramic material 18. This conductive ceramic layer 18 provides the bottom electrode of the cell assembly and is represented by the area ABCDEF in FIG. 1 for cell 11. The conductive ceramic layer is applied as a paste to substrate 10 by suitable means such as silk screening, hand or machine dipping or by spraying through a suitably apertured mask. After application to substrate 10, ceramic conductive layer 18 is suitably cured. Such curing process typically involves first drying at temperatures of from about 75° C. to about 150° C. for times ranging from about 0.05 to about 1 hour, preferably from about 0.1 to about 1 hour. Higher temperatures will require short drying times and vice-versa. Temperatures outside the above limits are useful but too low a temperature will require long drying time which will be uneconomical, whereas too high a drying temperature can result in poor adherence of and/or voids in the conductive ceramic layer due to rapid evaporation of solvent from the paste. Drying is followed by burn-out in air of organic materials such as organic screening materials such as resins, plasticisers, hardeners, wetting agents, thickeners and the like used in the paste formulations. Burn-out is typically carried out in air for from about 0.05 to about 1 hour and at temperatures ranging from about 100° C. to about 500° C., preferably from about 150° C. to about 500° C. and more preferably from about 250° to about 400° C. After burn-out, the conductive ceramic paste is fired in a neutral atmosphere such as nitrogen, argon, helium, and the like for about 0.05 to about 1 hour at peak temperatures ranging from about 500° C. to about 1200° C., preferably from about 500° C. to about 1100° C., more preferably from about 500° C. to about 1000° C. and yet more preferably from about 500° C. to about 950° C. This firing results in the sintering of the paste into a solid layer, and the adherence of the layer to the ceramic surface 17 of the substrate. Upon sintering the edges of the bottom electrode will be found to be rounded rather than sharp, which facilitates vapor deposition of the cadmium sulfide film 20 over the edges of the bottom electrode to the substrate 10, thus protecting the bottom electrode from deposition of copper during the barriering process. A copper layer would establish electrical contact between the bottom electrode and the barrier layer. Also, if sharp corners were present instead of rounded corners, the possibility of thin spots or pin holes in the cadmium sulfide film exists.

Suitable conductive ceramic pastes comprise: from about 30 to about 85 percent by weight and preferably from about 40 to about 75 percent by weight of a metal having a high electrical conductivity, such as, for example, nickel, silver, gold, palladium, platinum and copper with copper being preferred; from about 1 to about 40, preferably from about 1 to about 20 percent by weight of a metal oxide capable of forming, upon firing, a metal oxide-silica complex, thus allowing the conductive metal to wet the complex of the fired paste, copper oxide being preferred and of the copper oxides, cuprous and cupric, cuprous oxide being preferred; from about 3 to about 30 percent by weight, preferably from about 3 to about 20 percent by weight of a ground (<400 mesh) glass frit (powder), optionally from about 1 to about 20 percent by weight of a fluxing agent such as bismuth trioxide, antimony trioxide, lead oxide and the like, bismuth trioxide being preferred; from about 1 to about 10 percent by weight of a suitable screening agent such as ethyl cellulose, nitrocellulose and the like; and from about 1 to about 50, preferably from about 5 to about 45 percent by weight of a suitable solvent such as turpentine, pine oil, naptha, and the like. The screening agent is typically used in solution with a suitable solvent such as turpentine, pine oil, naptha, and the like. The concentration of the screening agent in the solvent typically ranges from about 10 to about 50 percent by weight. A paste composition that when dried and fired has been found to produce a copper-containing conductor with good electrical characteristics, excellent soldering and electroplating characteristics and good adhesion to the substrate is as follows: 66% wt. copper powder sieved to <400 mesh (37 microns), (Fernlock D-100, U.S. Bronze, Flemington, N.J.), 9% wt. cuprous oxide, 5% wt. bismuth trioxide, 5% wt. glass frit (Pemco S-2120-P manufactured by SCM Corp. of Baltimore, Maryland), 12% wt. of MM5 ethyl cellulose based screening vehicle (1.2% ethyl cellulose; 0.6% Poly-Pale resin hardener, Hercules; 0.12% CO-430 non-ionic wetting agent, GAF; 10.08% pine oil) and 3% wt. pine oil (solvent). The fired conductive ceramic layer typically has a thickness ranging from about 0.3 mils to about 2.0 mils, preferably from about 0.7 mils to about 1.2 mils. After sintering of this type of paste, the electrically conductive metal-containing bottom electrode will contain from about 70 to about 85 percent by weight of a metal in the zero valent state, from about 10 to about 20 percent by weight of ceramic and from about 5 to about 10 percent by weight of the metal oxide which is believed to form a complex with said ceramic.

Ceramic pastes having lower metal contents than the above described pastes can also be used. With lower metal content, the sintered conductive ceramic layer is advantageously electroplated with a metal having a high electrical conductivity such as, for example, silver, gold, platinum or copper, with copper being the preferred metals. The electrodeposition processes used are those which are well known in the art and are suitably adapted by those skilled in the art to the particular metal being deposited. Suitable conductive ceramic pastes encompassing the lower metal contents comprise from about 5 to about 40 and preferably from about 10 to about 30 percent by weight of a metal having a high electrical conductivity; such as, for example, nickel, silver, gold, palladium, platinum and copper with copper being preferred; from about 15 to about 75, preferably from about 20 to about 40 percent by weight of a metal oxide capable of forming, upon firing, a metal oxide-silica complex, thus allowing the conductive metal to wet the complex of the fired paste, copper oxide being preferred; and of the copper oxides, cuprous and cupric, cuprous being preferred; from about 2 to about 60, preferably from about 3 to about 50 percent by weight of a ground glass frit (<400 mesh); optionally from about 1 to about 20 percent by weight of a fluxing agent such as bismuth trioxide, antimony trioxide, lead oxide and the like, bismuth trioxide being preferred; from about 0.05 to about 10 percent by weight of a suitable screening agent such as ethyl cellulose, nitrocellulose and the like; and from about 1 to about 50, preferably from about 5 to about 45 percent by weight of a suitable solvent such as turpentine, pine oil, naptha, and the like. The screening agent is typically used in solution with a suitable solvent such as turpentine, pine oil, naptha, and the like. The concentration of the screening agent in the solvent typically ranges from about 2 to about 40 percent by weight. A paste composition that when dried and fired has been found to produce a low metal-containing conductive ceramic film that is readily electroplatable and has good adhesion to the substrate is as follows: 15% wt copper flake powder with the individual flakes having, on the average, a length of about 5-15 microns and a width of about 1-5 microns (MD 955 copper Flake-Alcan Metals), 28% wt. cuprous oxide, 12.4% wt. bismuth trioxide, 12.4% glass frit (S-2120-P Glass, 400 mesh (37 microns) PEMCO), 28.2% MM22 ethylcellulose based screening vehicle (2.82% ethyl cellulose; 1.41% Poly-Pale resin hardener, Hercules; 0.28% CO-430 non-ionic wetting agent, GAF; 23,69% pine oil), 4% wt. pine oil. After sintering of this type of paste, the electrically conductive, metal-containing bottom electrode will contain from about 5 to about 70 percent by weight of a metal in the zero valent state, from about 5 to about 50 percent by weight of ceramic and from about 5 to about 60 percent by weight of the metal oxide.

In general, the conductive ceramic paste will comprise from about 5 to about 85 percent by weight and preferably from about 10 to about 75 percent by weight of the metal having a high electrical conductivity, such as, for example, nickel, silver, gold, palladium, platinum and copper with copper being preferred; from about 1 to about 75, preferably from about 1 to about 60 percent by weight of a metal oxide capable of forming, upon firing, a metal oxide-silica complex, thus allowing the conductive metal to wet the complex of the fired paste, copper oxide being preferred, and of the copper oxides, cuprous and cupric, cuprous oxide being preferred; from about 2 to about 60, preferably from about 3 to about 50 percent by weight of a ground glass frit (<400 mesh); optionally from about 1 to about 20 percent by weight of a fluxing agent such as bismuth trioxide, antimony trioxide, lead oxide and the like, bismuth trioxide being preferred; from about 0.05 to about 10 percent by weight of a suitable screening agent such as ethyl cellulose, nitrocellulose and the like; and from about 1 to about 50, preferably from about 5 to about 45 percent by weight of a suitable solvent such as turpentine, pine oil, naptha, and the like. The screening agent is typically used in solution with a suitable solvent such as turpentine, pine oil, naptha, and the like. The concentration of the screening agent in the solvent typically ranges from about 2 to about 40 percent by weight. After sintering, the electrically conductive, metal-containing bottom electrode will contain from about 15 to about 85 percent by weight of zero valent metal, from about 5 to about 50 percent by weight of ceramic and from about 5 to about 60 percent by weight of the metal oxide which is believed to form a complex with said ceramic.

Other methods of producing metal-containing conductive ceramic films are known in the art and are considered within the scope of this invention.

When the conductive metal in the conductive ceramic layer is a metal of the type which would form a rectifying barrier with cadmium sulfide or would oxidize on the surface to form a poor ohmic contact with cadmium sulfide, then it is desirable to coat the conductive ceramic with a transition layer 19 of metal or metal alloy which does not have the above drawbacks. Copper, for example, would form a barrier with cadmium sulfide. Aluminum would oxidize and the layer of exposed aluminum oxide would be an insulator and would give a high resistance contact with cadmium sulfide. Suitable metals for the metal transition layer include gold, silver, platinum, cadmium, zinc and alloys thereof. Zinc is preferred. More than one layer of metal may be deposited on the conductive ceramic substrate.

The metal transition layer is applied to the conductive ceramic layer in any suitable manner. For example, it may be applied by vapor deposition through a suitably apertured mask, by electrodeposition from a solution of salts of the metal, or by contact with a molten bath of metal. These processes are well known in the art and will be suitably adapted by one skilled in the art to the particular metal being deposited. The metal transition layer will be applied in an amount, for example, ranging from about 0.0001 to about 0.01 gm/sq cm. preferably from about 0.001 to about 0.002 gm/sq cm, with zinc being a preferred metal.

The bottom electrode of the cell comprises either the conductive ceramic layer, or the conductive ceramic layer covered with a metal transition layer when used. Upon this bottom electrode a semiconductor material of n-type conductivity such as cadmium sulfide film 20 is deposited. This can be done in a known manner, such as through a suitably apertured mask from the vapor state, in an amount of between about 0.05 gm/sq cm and about 0.005 gm/sq cm. The cadmium sulfide film 20 covers and completely overlaps all but a small portion of the bottom electrode, this area being represented by ADEF shown in FIG. 1 for cell 11. The uncovered portion is represented by the area ABCD and can be used subsequently either for electrical connecting means to an adjacent cell, such as the top electrode of an adjacent cell to make a series connection therewith as shown in FIG. 1, or for a negative output terminal such as 14. It is important that the cadmium sulfide film 20 in each of the cells 11–13, for example, overlaps the periphery of the bottom electrode 19, such as, the edges AF, DE, and FE thereof, and extends to the surface of substrate 10 because the subsequent overlapping films and the top electrode in each cell must not contact the bottom electrode layers 19 or 18 thereof. As discussed before, the use of a sintered ceramic bottom electrode 20 facilitates this covering, since the sintering process produces rounded and filleted edge surfaces which are easily covered by cadmium sulfide during the vapor deposition process.

After deposition of the cadmium sulfide, a strip of insulating material 24, such as silicon dioxide or cured epoxy resin is deposited along the edge AD of the cadmium sulfide layer 20 as well as upon most of the substrate area extending beyond edge AD. The purpose of the insulating film is to prevent the cuprous sulfide film 21 from coming in contact with the bottom electrode 19 which would short out the p-n junction between the cadmium sulfide and cuprous sulfide layers. This insulating layer 24 also allows the top electrode from one cell to be connected to the exposed part of the bottom electrode of an adjacent cell without shorting to its own bottom electrode.

The surface of the cadmium sulfide film 20 may be etched with hydrochloric acid for about 4–5 seconds, if desired, before the cuprous sulfide films are formed thereon, as described in Tanos, U.S. Pat. No. 3,480,473. The cuprous sulfide film 21 is formed in a suitable fashion such as, for example, deposition from the vapor state through a suitably apertured mask, over the cadmium sulfide film 20, or by contacting the cadmium sulfide film 20 with an aqueous solution of a cuprous salt as, for example, a cuprous chloride or bromide solution, as described in Keramidas, U.S. Pat. No. 3,374,108. The cuprous sulfide film 21 will have a thickness between about 1000 Å and about 10,000 Å.

A top electrode is fixed to each cell. The top electrode can suitably be any material of high electrical conductivity. It must allow, or be shaped to allow, light to reach the cuprous sulfide layer. Such electrodes are known in the art. Preferably, and as shown in FIG. 1, the top electrode comprises a plurality of electrode strips 22 which terminate in tab 23 at one end, AD, and in a bar at end FE. The electrode strips are placed in electrical contact with the cuprous sulfide film 21 while tab 23 extends over insulating strip 24 to electrically contact a portion, BCJI, of bottom electrode 19 of an adjacent cell to electrically connect the two cells in series. As shown, the top electrode for cell 12 connects with the bottom electrode of cell 11, and the bottom electrode of cell 11, and the bottom electrode of cell 12 is connected to the top electrode of cell 13. For end cell 11, the top electrode tab will be the positive terminal 15 for the array.

The top electrode may be provided in any known manner, such as by deposition through a suitably apertured mask from the vapor state over the cuprous sulfide film 21. Alternatively, the top electrode may be vapor deposited on a flexible insulating film such as Mylar, Aclar, or TFE and then the film 25 pressed onto the cell with top electrode strips 22 in contact with cuprous sulfide film 21 and held in place with light transmissive epoxy cement 26. The top electrode can also be a grid, or mesh, of fine metal wire which is attached to the cuprous sulfide film. The top electrode may be any suitable electrical conductor having a high electrical conductivity, which forms a good ohmic contact with cuprous sulfide film 21, and which will not form a p-n barrier junction with the cuprous sulfide film. Suitable electrical conductors are, for example, metals such as gold, platinum and silver.

The finished cell assembly is typically heat treated, e.g., at 200° C. for 10 minutes and sealed with a protective light transmitting coating, a film or plate 27 of a material such as glass or the like. The film should be impervious to oxygen and water vapor which would degrade the cell.

In operation, the cells, 11, 12, and 13 convert light into electrical energy when they are exposed to light. In each cell, light energy passes through the area not covered by top electrode strips 22 to the cuprous sulfide film 21 where it is at least partially absorbed thereby producing a voltage between the bottom electrode and the top electrode. Since this voltage for a photovoltaic, cadmium sulfide cell is typically about 0.4–0.5 volts, the cells 11–13 are connected in series to provide a desired voltage. The current capacities at the desired voltage may be increased by connecting a plurality of the serially connected rows of cells in parallel.

In generic terms the invention provides an integrated array of connected, thin-film photovoltaic cells comprising:

a substrate of electrically insulating ceramic material;

a plurality of said cells integrally united to a major surface of said substrate in a spaced-apart relationship, each of said cells comprising:

an electrically conductive, metal-containing, ceramic bottom electrode coated on said substrate and bonded thereto by fusing or sintering;

a film of first semiconducor material of one type conductivity covering and overlapping all but a portion adjacent an edge of said bottom electrode;

a film of second semiconductor material of an opposite type conductivity of said first film of semiconductor material and forming a p-n junction therewith; and, a top electrode, capable of transmitting radiant energy, in contact with said second semiconductor material;

said top electrode of one cell being connected to selected top and bottom electrode of an adjacent cell to provide electrically series or parallel arrangement of the cells.

This invention further provides a method of making an integrated array of connected, thin-film photovoltaic cells comprising:

providing a substrate of insulating ceramic;

providing on a major surface of said substrate a plurality of electrically conductive, ceramic bottom electrodes, a separate one of said bottom electrodes being for each of said cells, by coating the substrate with a paste of conducting ceramic, and heat treating to dry and bond the conductive ceramic to the substrate;

coating each of said bottom electrodes, except for a portion adjacent an edge thereof, with a film of first semiconductor material of one type conductivity;

coating each of said films of one type conductivity with a relatively thin film of second semiconductor material of an opposite type conductivity, and forming a p-n junction therewith;

attaching a top electrode on each of said second films, selected ones of said top and bottom electrodes of one cell extending to, and making connection with, selected top and bottom electrodes of adjacent cells to connect the cells in series or in parallel arrangement.

What is claimed is:

1. A method of making an integrated array of connected, thin-film, photovoltaic cells comprising:
   (1) providing a substrate of insulating material;
   (2) coating a major surface of said substrate with a paste which upon heat treating provides a sintered conductive ceramic layer forming a plurality of electrically conductive bottom electrodes, a separate one of said bottom electrodes being for each of said cells, said paste comprising from about 5 to about 85 percent by weight of finely divided metal particles, from about 1 to about 75 percent by weight of a metal oxide capable of forming, upon firing, a metal oxide-silica complex, from about 2 to about 60 percent by weight of a glass frit compatible with and capable of bonding with said substrate, from about 0.05 to about 10 percent by weight of a screening agent(s) and from about 5 to about 45 percent by weight of a solvent;
   (3) heat treating the paste coated substrate produced in step (2) above to dry and remove solvent and screening agents from said paste and to convert said paste to an electrically conductive ceramic which is bonded to said substrate, forming said bottom electrodes;
   (4) coating each of said bottom electrodes, except for a portion adjacent an edge thereof, with a film of first semiconductor material of one type conductivity;
   (5) coating each of said films of one type conductivity with a relatively thin film of second semiconductor material of an opposite type conductivity, and forming a p-n junction therewith; and
   (6) attaching a light transmitting top electrode on each of said second semiconductor films, and connecting top and bottom electrodes of one cell with selected top and bottom electrodes of adjacent cells to provide series or parallel arrangement of the cells.

2. The method of claim 1, wherein said paste comprises from about 30 to about 85 percent by weight of the finely divided metal particles, from about 1 to about 40 percent by weight of the metal oxide and from about 3 to about 30 percent by weight of the glass frit.

3. The method of claim 1, wherein said paste comprises from about 5 to about 40 percent by weight of the metal particles.

4. The method of claim 1, wherein the conducting ceramic is coated with at least one metal layer, one of which provides ohmic contact with the first semiconductor material, prior to coating the bottom electrode with the film of the first semiconductor material.

5. The method of claim 4, wherein said metal particles are copper, said metal oxide comprises cuprous oxide, said metal coating is zinc, said first semiconductor material is cadmium sulfide, and said second semiconductor material is cuprous sulfide.

6. The method of claim 1, wherein said paste is dried at a temperature of from about 75° C. to about 150° C. for about 0.05 to about 1 hour, heated at from about 100° C. to about 500° C. in air to burn out organic material, and fired at from about 500° C. to about 1100° C. for from about 0.05 to about 1 hour in an inert atmosphere to fuse the conductive ceramic to the insulating ceramic substrate.

7. The method of claim 1, wherein the paste comprises from about 1 to about 20 percent by weight of a metal oxide fluxing agent.

8. The method of claim 3, wherein the conductive ceramic is coated with at least one metal layer, one of which provides ohmic contact with the first semiconductor material, prior to coating the bottom electrode with a film of the first semiconductor material.

9. The method of claim 8 wherein said metal particles are copper, said metal oxide comprises cuprous oxide, said metal coating is a layer of copper and a layer of zinc with the zinc in ohmic contact with the first semiconductor material, said first semiconductor material is cadmium sulfide, and said second semiconductor material is cuprous sulfide.

10. The method of claim 9, wherein said paste is dried at a temperature of from about 75° C. to about 150° C. for about 0.05 to about 1 hour, heated at from about 100° C. to about 500° C. in air to burn out organic material, and fired at from about 500° C. to about 1100° C. for from about 0.05 to about 1 hour in an inert atmosphere to fuse the conductive ceramic to the insulating ceramic substrate.

* * * * *